United States Patent
Nishimura et al.

(10) Patent No.: US 8,652,869 B2
(45) Date of Patent: Feb. 18, 2014

(54) METHOD FOR ROUGHENING SUBSTRATE SURFACE AND METHOD FOR MANUFACTURING PHOTOVOLTAIC DEVICE

(75) Inventors: Kunihiko Nishimura, Tokyo (JP); Shigeru Matsuno, Tokyo (JP); Daisuke Niinobe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 21 days.

(21) Appl. No.: 13/256,771

(22) PCT Filed: Aug. 27, 2009

(86) PCT No.: PCT/JP2009/064938
§ 371 (c)(1),
(2), (4) Date: Sep. 15, 2011

(87) PCT Pub. No.: WO2010/109692
PCT Pub. Date: Sep. 30, 2010

(65) Prior Publication Data
US 2012/0015470 A1    Jan. 19, 2012

(30) Foreign Application Priority Data
Mar. 25, 2009  (JP) .................. 2009-074185

(51) Int. Cl.
*H01L 21/302* (2006.01)
(52) U.S. Cl.
USPC .............. 438/71; 438/48; 438/57; 438/753; 257/E21.214; 257/E23.13; 257/53

(58) Field of Classification Search
USPC .............. 438/71, 753, 48, 57; 257/E21.214, 257/E23.13, 53
See application file for complete search history.

(56) References Cited

U.S. PATENT DOCUMENTS

| 4,322,571 A | 3/1982 | Stanbery |
| 6,147,297 A | 11/2000 | Wettling et al. |

(Continued)

FOREIGN PATENT DOCUMENTS

| JP | 10 303443 | 11/1998 |
| JP | 11 508088 | 7/1999 |

(Continued)

OTHER PUBLICATIONS

English machine translation of Japanese Patent JP 2008-227070 assigned to Nishimura (dated Sep. 25, 2008).*

(Continued)

*Primary Examiner* — Thinh T Nguyen
(74) *Attorney, Agent, or Firm* — Oblon, Spivak, McClelland, Maier & Neustadt, L.L.P.

(57) ABSTRACT

A method of roughening a substrate surface includes forming an opening in a protection film formed on a surface of a semiconductor substrate, performing a first etching process using an acid solution by utilizing the protection film as a mask so as to form a first concave under the opening and its vicinity area, performing an etching process by using the protection film as a mask so as to remove an oxide film formed on a surface of the first concave, performing anisotropic etching by using the protection film as a mask so as to form a second concave under the opening and its vicinity area, and removing the protection film.

8 Claims, 12 Drawing Sheets

(56) References Cited

U.S. PATENT DOCUMENTS

| | | | | |
|---|---|---|---|---|
| 6,156,968 | A | * | 12/2000 | Nishimoto et al. ............ 136/252 |
| 6,340,640 | B1 | | 1/2002 | Nishimoto et al. |
| 6,391,145 | B1 | | 5/2002 | Nishimoto et al. |
| 7,342,201 | B1 | * | 3/2008 | Heuberger et al. ........... 219/270 |
| 7,432,201 | B2 | * | 10/2008 | Takehara et al. ............. 438/685 |
| 2007/0020903 | A1 | * | 1/2007 | Takehara et al. ............. 438/592 |
| 2010/0120188 | A1 | * | 5/2010 | Nishimura et al. ............. 438/57 |

FOREIGN PATENT DOCUMENTS

| | | |
|---|---|---|
| JP | 2003 309276 | 10/2003 |
| JP | 2004 134494 | 4/2004 |
| JP | 2004 134499 | 4/2004 |
| JP | 2006 93418 | 4/2006 |
| JP | 2007 103572 | 4/2007 |
| JP | 2008 227070 | 9/2008 |
| WO | 2009 016776 | 2/2009 |

OTHER PUBLICATIONS

International Search Report issued Nov. 17, 2009 in PCT/JP09/064938 filed Aug. 27, 2009.

Combined Office Action and Search Report issued Mar. 28, 2013 in Chinese Patent Application No. 200980158262.8 with English language translation and English translation of categories of cited documents.

Supplementary European Search Report mailed Nov. 7, 2013, in counterpart European Appln No. 09 84 2302 (10 pages).

Borojevic, A., et al. "Inkjet Texturing for High Efficiency Commercial Silicon Solar Cells", 23rd European Photovoltaic Solar Energy Conference and Exhibition, Sep. 1-5, 2008, Valencia, Spain, pp. 1829-1832.

Ostendorf, A., et al., "Lasers in energy device manufacturing", Laser-based Micro- and Nanopackaging and Assembly II, edited by Wilhelm Pfleging, et al., Proc. Of SPIE vol. 6880,6880B, (2008)—0277-786X/08/$18—doi: 10.1117/12.760350 (10 pages).

Office Action with partial English translation mailed Sep. 3, 2013, in counterpart Chinese Appln No. 200980158262.8 (13 pages).

* cited by examiner

METHOD FOR ROUGHENING SUBSTRATE SURFACE AND METHOD FOR MANUFACTURING PHOTOVOLTAIC DEVICE

FIELD

The present invention relates to a method for roughening a substrate surface and a method for manufacturing a photovoltaic device.

BACKGROUND

To improve performance of photoelectric conversion devices such as solar batteries, it is important to efficiently take sunlight inside substrates that constitute the solar batteries. Therefore, texture processing is performed on a light-incident-side substrate surface to allow light reflected by the surface to enter again the on surface, so that much sunlight is taken inside the substrate for improving the photoelectric conversion efficiency. In the texture processing, fine concaves and convexes having a size of several tens of nanometers to several tens of micrometers are intentionally formed in the substrate surface.

A pyramid shape or an inverted pyramid shape is known as a representative example of a texture shape. The pyramid shape is a shape obtained by placing a quadrangular pyramid on a plane, and the inverted pyramid shape is a concavity shape that a quadrangular pyramid placed facedown is dug into the plane. When inverted pyramid textures are arranged on a substrate without spaces therebetween, the entire substrate surface is constituted by inclined surfaces of inverted pyramids. Almost all of reflected light at an inclined surface enters again an adjacent inclined surface and thus the light use efficiency is maximized.

To form such an inverted pyramid shape, the dependency of a silicon etching rate with respect to an alkaline aqueous solution on surface orientation is utilized. That is, when crystal silicon is etched by an alkaline aqueous solution, its etching rate is high for <100> crystal surface orientation and low for <111> crystal surface orientation. When a crystal silicon substrate whose surface has a <100> crystal surface orientation is etched by an alkaline aqueous solution, the etching rate is significantly reduced at a time when etching proceeds to a certain degree and a <111> surface is exposed. Consequently, a pyramid shape or an inverted pyramid shape formed of the <111> surface is formed.

However, according to this method, the size and arrangement of pyramid-shaped or inverted pyramid-shaped fine concaves and convexes become random and the reflectance cannot be necessarily suppressed to a minimized one. To solve this problem, an etching mask patterned in advance is formed on a substrate and an etching is performed. Consequently, fine concaves and convexes having a desired size can be formed at desired positions. In such a method, a resist can be used as the etching mask and a photolithography technique can be used as a patterning method. A method of using a silicon nitride film as the etching mask and laser processing as the patterning method has been proposed as another method (see, for example, Patent Literature 1).

This method is explained below. A silicon substrate is etched by using an acid or alkaline solution to remove a damaged layer at the time of slicing. Subsequently, an SiN$_x$ film (silicon nitride film) is formed as an etching mask by PECVD (plasma-enhanced chemical vapor deposition). A pattern opening is formed in this etching mask by a laser. The silicon substrate is etched by using an acid or alkaline solution to form concaves on the silicon substrate.

However, a laser processing time is a problem in this method. Because laser processing corresponding to the area of a concave is performed, a laser processing area must be increased with respect to a surface area to form fine concaves and convexes over the entire surface of the silicon substrate. This requires a long processing time that is far from practical solar-battery production processing and thus the entire processing time has to be extended.

Therefore, there is considered the following method. That is, a dot-shaped small area is processed by the laser processing, etching by a mixed solution of hydrofluoric acid and nitric acid is subsequently performed to form an undercut under a mask, and finally etching by an alkaline aqueous solution is performed, so that the undercut is formed in an inverted pyramid shape. Because the size of a concave shape can be larger than that of the laser processing by the undercut, even when a laser processing diameter is small, a concave-convex shape can be finally laid on the entire surface. As such a method, a method of performing etching by an alkaline aqueous solution subsequent to etching by hydrofluoric acid and nitric acid has been proposed (see, for example, Patent Literature 2).

CITATION LIST

Patent Literatures

Patent Literature 1: Japanese Patent Application Laid-open No. 2007-103572
Patent Literature 2: Japanese Patent Application Laid-open No. H10-303443

SUMMARY

Technical Problem

As the present inventors experimentally confirmed whether inverted pyramid-shaped fine concaves and convexes were formed by the method explained above, while it was confirmed that an undercut was formed under a mask by the etching by an aqueous solution of hydrofluoric acid and nitric acid, problems occurred at the next step, that is, the etching by an alkaline aqueous solution. That is, even when a silicon substrate was immersed in an alkaline aqueous solution, the inverted pyramid shape was not formed uniformly on the entire surface. A part where the inverted pyramid shape was partially formed and a part where etching did not proceed at all existed. It is conceivable that this is because the silicon surface etched by an aqueous solution of hydrofluoric acid and nitric acid is hydrophilic. In addition, a large amount of oxygen was detected around the surface by an element analysis. As a result, it is believed that an oxide film formed on the surface hinders the etching by an alkaline aqueous solution.

The present invention has been achieved in view of the above problems, and an object of the present invention is to provide a method for roughening a substrate surface that can uniformly form an inverted pyramid-shaped concave-convex structure over a wide area of a substrate by processing in a short time, and a method for manufacturing a photovoltaic device.

Solution to Problem

In order to solve the aforementioned problems and attain the aforementioned object, a method for roughening a substrate surface according to one aspect of the present invention is constructed in such a manner as to include: a first step of forming a protection film on a surface of a semiconductor substrate; a second step of forming an opening in the protection film; a third step of isotropically etching a surface of the semiconductor substrate on which the protection film is formed by using the protection film in which the opening is formed as a mask so as to form a first concave under the opening and its vicinity area; a fourth step of etching a surface of the semiconductor substrate on which the protection film is formed by using the protection film in which the opening is formed as a mask so as to remove an oxide film formed on a surface of the first concave; a fifth step of anisotropically etching a surface of the semiconductor substrate on which the protection film is formed by using the protection film in which the opening is formed as a mask so as to form a second concave under the opening and its vicinity area; and a sixth step of removing the protection film.

Advantageous Effects of Invention

According to the present invention, without requiring any expensive devices and redundant manufacturing steps as those in lithography, an inverted pyramid-shaped concave-convex structure is uniformly formed over a wide area of a substrate by processing in a short time to perform easily and uniformly fine roughening, and roughening of a substrate that exhibits an excellent reflection-suppressing effect can be made.

DESCRIPTION OF EMBODIMENTS

Figure 1:
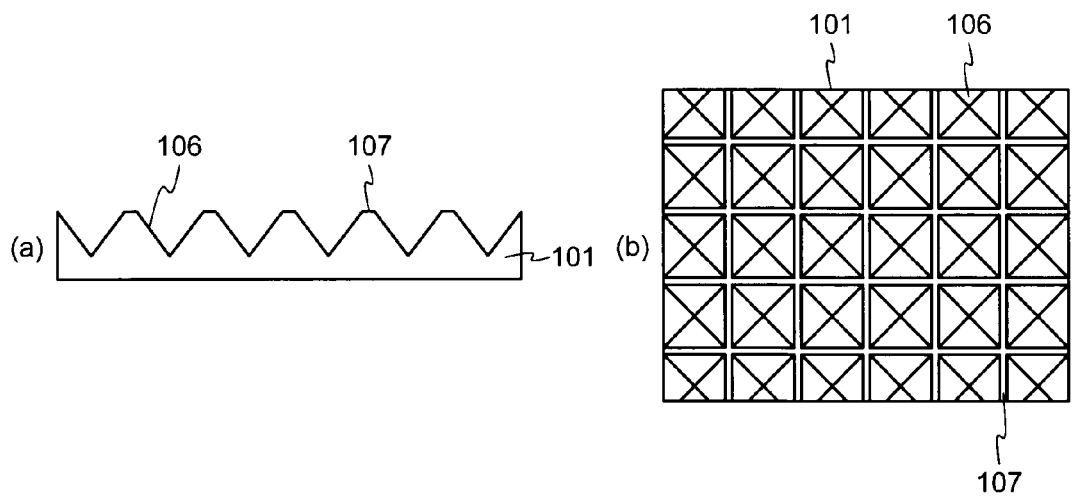
FIG. 1 depicts a p-type single-crystal silicon substrate having its surface roughened by a method for roughening a substrate surface according to a first embodiment of the present invention.

Embodiments of a method for roughening a substrate surface and a method for manufacturing a photovoltaic device according to the present invention will be explained below in detail with reference to the accompanying drawings. The present invention is not limited to the descriptions of the following embodiments and various modifications can be appropriately made without departing from the scope of the invention. In the drawings explained below, scales of respective members may be shown differently from those in practice to facilitate understanding. The same applies to the relationships between the drawings.

First Embodiment

FIG. 1 depicts a first conductive-type substrate for solar battery as a photovoltaic device, that is, a p-type single-crystal silicon substrate 101 (hereinafter, "substrate 101") having its surface roughened by a method for roughening a substrate surface according to a first embodiment. FIG. 1(*a*) is a cross-sectional view and FIG. 1(*b*) is a top view. In the following explanations, among two main surfaces of the substrate 101, one main surface subjected to surface roughening is called "light-receiving-surface-side main surface" and the other main surface is called "back-side main surface". In the cross-sectional view, its top is shown as a light-receiving-surface side. The top view is viewed from the light-receiving-surface side. The substrate 101 has a texture structure such that an inverted pyramid-shaped fine concave 106 with an average pitch between holes of about 10 micrometers is substantially uniformly formed on a light-receiving-surface-side substrate surface.

A method for roughening a substrate surface according to the first embodiment for forming the substrate 101 is explained next. FIGS. 2 to 8 are explanatory diagrams of steps of the method for roughening a substrate surface according to the first embodiment. In FIGS. 2 to 8, the drawings to which (a) is attached are cross-sectional views and correspond to FIG. 1(a), and the drawings to which (b) is attached are top views and correspond to FIG. 1(b). The method for roughening a substrate surface according to the first embodiment is explained below with reference to these drawings.

At Step 1, a mask film 102 having etching resistance to etching (described later) is formed as a protection film on one-surface-side surface of a p-type single-crystal silicon substrate 101a (hereinafter, "substrate 101a") whose surface is to be roughen.

Figure 2:
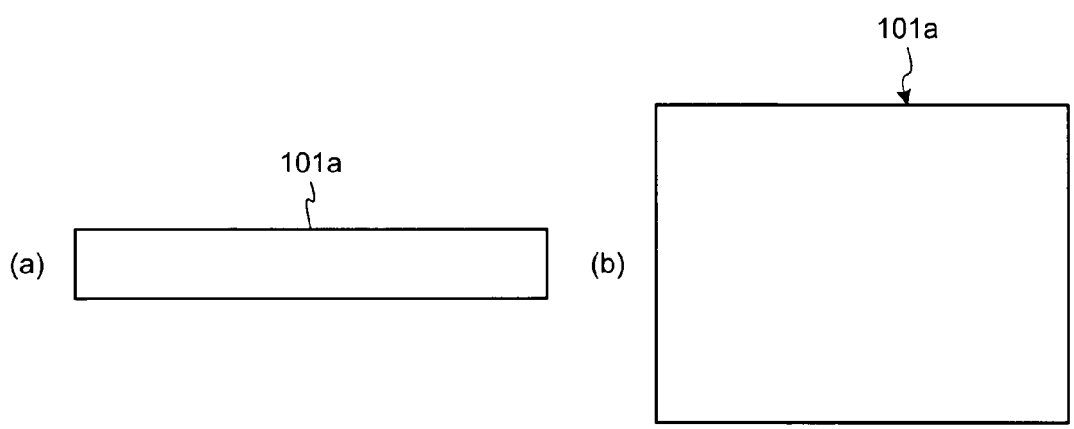
FIG. 2 is an explanatory diagram of a step of the method for roughening a substrate surface according to the first embodiment of the present invention.

The substrate 101a shown in FIG. 2 is prepared first. The substrate 101a is obtained by slicing a silicon ingot produced by casting or pulling using a multi-wire saw, then washing the resultant one using an organic solvent, and removing damaged layers by an acid solution or an alkaline solution. According to the present embodiment, a 156×156-mm square p-type single-crystal silicon substrate having a thickness of 180 micrometers was used. The size of the substrate 101a is not limited to the above one and can be appropriately changed. To remove damaged layers, the substrate 101a was immersed in, for example, a 10% by-weight aqueous solution of sodium hydroxide heated to 80° C., for about 2 minutes for an immersion process. Conditions for damaged layer removal are not limited to these conditions. As long as damaged layers can be removed, conditions other than the above ones can be used.

While a single-crystal silicon substrate is used as the substrate 101a in the first embodiment, a polycrystalline silicon substrate can be used. The case of using a polycrystalline silicon substrate is advantageous because this substrate can be obtained inexpensively. While a p-type silicon substrate is used as the substrate 101a in the first embodiment, an n-type substrate can be used.

Figure 3:
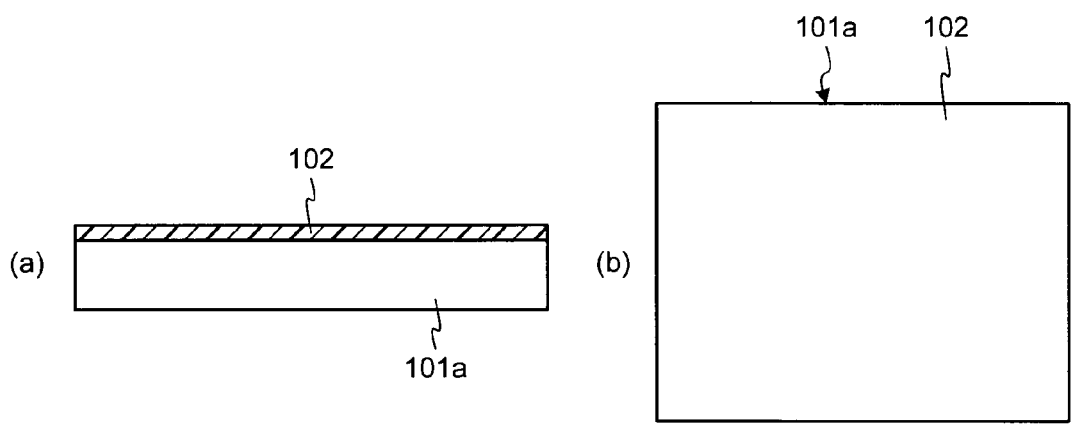
FIG. 3 is an explanatory diagram of a step of the method for roughening a substrate surface according to the first embodiment of the present invention.

As shown in FIG. 3, the mask film 102 is formed on the one-surface-side surface of the substrate 101a. In the first embodiment, a silicon nitride film (an $SiN_x$ film) having a thickness of 10 nanometers was formed as the mask film 102 by PECVD (plasma-enhanced chemical vapor deposition). While a silicon nitride film is used as the mask film 102 in the first embodiment, other materials for the mask film 102 can be selected as long as openings can be formed at subsequent steps and etching selectivity with respect to the substrate 101a is provided. A silicon oxide film (an $SiO_2$ film), a metal film, and an organic film can be used. The thickness of the mask film 102 can be selected by considering a film forming rate, the etching selectivity, and removability and is not limited to 10 nanometers.

Figure 4:
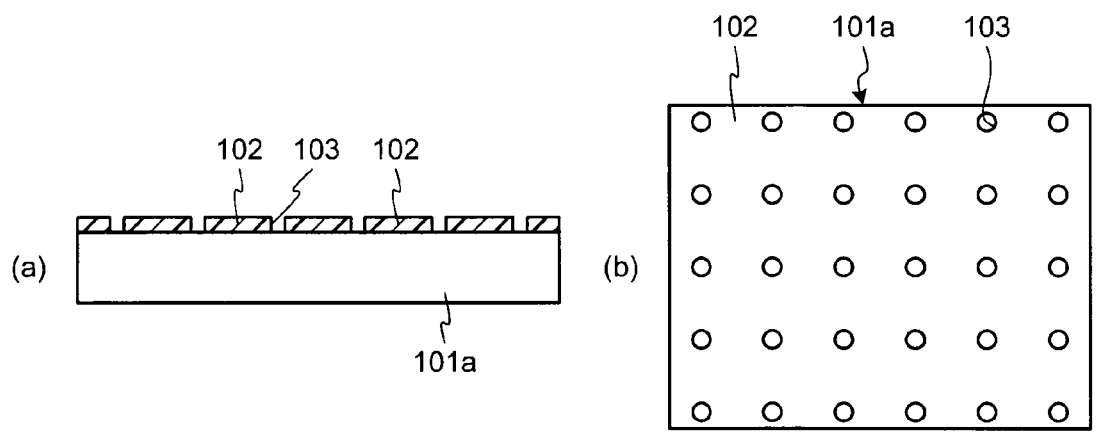
FIG. 4 is an explanatory diagram of a step of the method for roughening a substrate surface according to the first embodiment of the present invention.

At the subsequent Step 2, fine hole processing is performed on the mask film 102 as shown in FIG. 4. That is, a plurality of fine openings 103 are formed in the mask film 102 by a laser processing treatment. In the present embodiment, a 355-nm laser, which was a third harmonic wave of Nd—YAG laser, was used as a laser. As shown in FIG. 4, fine holes having a diameter of 2 micrometers were processed on lattice points of a tetragonal lattice that a distance between points was 10 micrometers.

For the laser processing, a laser whose intensity distribution was Gaussian distribution was made to enter an HOE (holographic optical element) that was one of interference optical devices to be branched into a plurality of beams. The branched beams passed through an optical system to be imaged on the substrate 101a. The number of branches of the HOE used was 100 and its light use efficiency was 91% in the present embodiment. Comparing to a multi-point irradiation method by light shielding using apertures, the branching method using HOE is advantageous because each branched beam has a light intensity distribution according to the Gaussian distribution, a light intensity difference between the branched beams is small, and the light use efficiency is high. To process fine holes over the entire surface of the substrate 101a, the laser processing was performed on the substrate 101a while the substrate 101a was moved horizontally on a precision stage. The rate of the stage required for continuous processing can be calculated by a laser oscillation frequency and a width of a processed area in single laser processing.

While HOE is used as the multi-point irradiation method in the present embodiment, the entire surface of the substrate 101a can be processed by the multi-point irradiation by light shielding using apertures or by a combination of single-point irradiation and stage movement as long as desired fine hole processing can be performed, which is not problematic for realizing the present invention.

While the horizontal movement of the substrate 101a by the precision stage is utilized to process the entire surface of the substrate 101a in the present embodiment, the entire surface of the substrate 101a can be processed by optically scanning laser light branched into multiple points by using a combination of a galvo-mirror and an fθ lens. Further, while a laser having a wavelength of 355 nanometers is used as the laser in the present embodiment, as long as desired fine hole processing can be performed, other types of lasers and lasers with other wavelengths can be used, which does not cause any problem for realizing the present invention.

Figure 5:
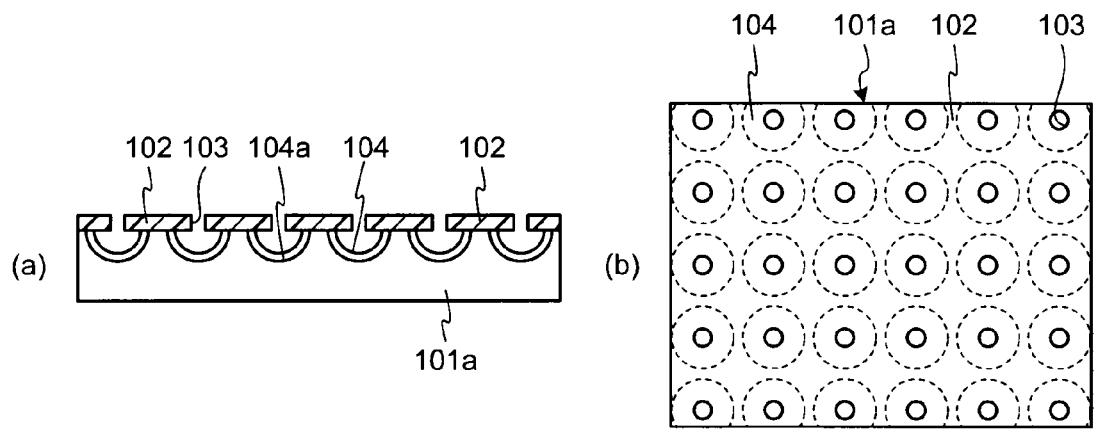
FIG. 5 is an explanatory diagram of a step of the method for roughening a substrate surface according to the first embodiment of the present invention.

At the subsequent Step 3, isotropic etching is performed as a first etching step. That is, the substrate 101a is immersed in an acid solution and etched by using the mask film 102 as an etching mask. The surface of the substrate 101a exposed at the bottom of the fine opening 103 of the mask film 102 is thus isotropically etched, so that a first concave 104 is formed as shown in FIG. 5. At this time, an oxide film 104a is formed on the surface of the first concave 104.

An aqueous solution of hydrofluoric acid and nitric acid prepared by mixing 50% hydrofluoric acid with 69% nitric acid at a volume ratio of 1:7 was used as an acid solution in an etching solution in the present embodiment. The temperature of chemical is 10° C. When silicon is etched by this etching solution, the etching does not depend on a crystal surface orientation but proceeds substantially isotropically, so that a substantially semi-spherical first concave 104 is formed as shown in FIG. 5. This etching characteristic is important for forming an undercut under the mask film 102. This etching characteristic is also important for enabling reduction in an opening area of the mask film 102 by the laser processing, that is, reduction in a laser processing time. The first etching step ended when the diameter of the first concave 104 was 8 micrometers in the present embodiment.

As the etching solution, an additive such as acetic acid or phosphoric acid can be added to the aforementioned aqueous solution of hydrofluoric acid and nitric acid. Alternatively, this aqueous solution can be diluted by pure water. The mixing ratio of the hydrofluoric acid and the nitric acid can be freely changed. In the present embodiment, while the temperature of chemical is set to 10° C., which is lower than a room temperature to improve an etching selection ratio between the mask film (the silicon nitride film) used in the present embodiment and silicon, as long as the first concave 104 is desirably formed, other temperatures can be used, which does not cause any problem for realizing the present invention.

Figure 6:
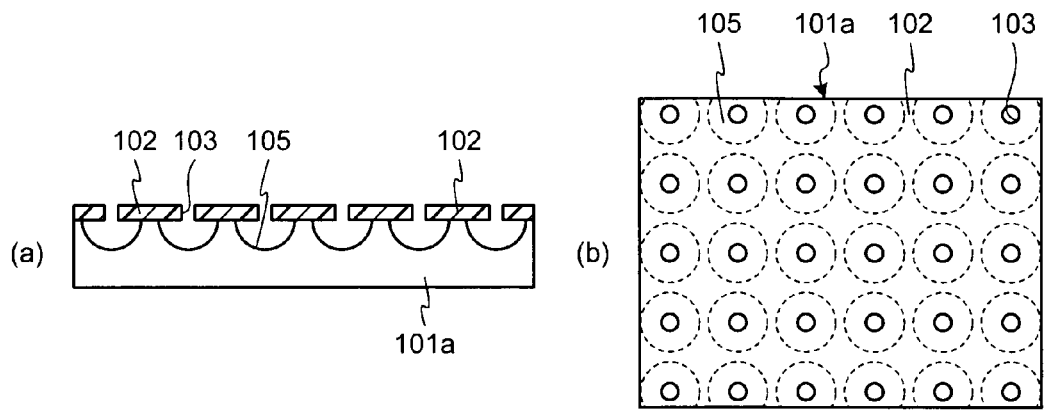
FIG. 6 is an explanatory diagram of a step of the method for roughening a substrate surface according to the first embodiment of the present invention.

At the subsequent Step 4, oxide-film removal etching that is a characteristic of the present invention is performed as a second etching step. That is, the substrate 101a subjected to the first etching step is immersed in an aqueous solution of hydrofluoric acid and etched by using the mask film 102 as an etching mask so as to remove the oxide film 104a, so that a surface 105 of a first concave is exposed as shown in FIG. 6. In the present embodiment, an aqueous solution of hydrofluoric acid prepared by diluting 50% hydrofluoric acid with water so as to be 20% by volume was used as an etching solution. The temperature of chemical is a room temperature and a processing time is 30 seconds.

At Step 3 as the first etching step, a silicon oxide film is formed on the silicon surface by nitric acid simultaneously with removal of a silicon oxide film by hydrofluoric acid. Accordingly, at the time when Step 3 is completed, a silicon oxide film (a chemical oxide film) is formed on the silicon surface. When a silicon oxide film is formed on a silicon surface, it is well known that etching by alkali does not proceed.

As the result of actual experiment by the present inventors, at the time when Step 3 was completed, the surface of the first concave 104 was hydrophilic. When etching by alkali was subsequently performed, a part where etching proceeded and a part where etching did not proceed existed in a mixed manner and etching unevenness occurred in the surface. An element analysis was performed in a depth direction by secondary ion mass spectrometry (SIMS). Oxygen of high density was detected around the surface and the existence of a silicon oxide film was confirmed. Meanwhile, after Step 4 as the second etching step, the surface 105 of a first concave was hydrophobic. As the result of the SIMS analysis, the oxygen density was significantly reduced around the surface and it was confirmed that the silicon oxide film was removed.

The ratio of an etching solution, the temperature of chemical, and the processing time at this step can be freely selected as long as attention is paid so that the removal of a silicon oxide film is performed simultaneously with making a mask film remain.

Figure 7:
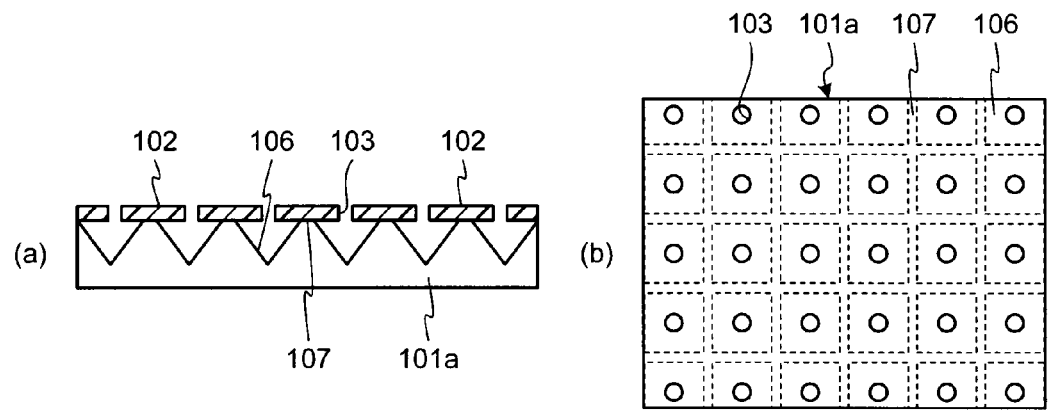
FIG. 7 is an explanatory diagram of a step of the method for roughening a substrate surface according to the first embodiment of the present invention.

At the subsequent Step 5, anisotropic etching is performed as a third etching step. That is, the substrate 101a subjected to the second etching step is immersed in an alkaline solution and etched by using the mask film 102 as an etching mask, so that the surface of the substrate 101a exposed under the fine opening 103 of the mask film 102 (a the surface 105 of a first concave) is anisotropically etched. Consequently, the second concave (the inverted pyramid-shaped fine concave) 106 is formed as shown in FIG. 7.

In the present embodiment, an alkaline aqueous solution prepared by adding 1% by weight of IPA (isopropyl alcohol) to a 10% by-weight aqueous solution of sodium hydroxide was used. A single-crystal silicon substrate whose surface has a <100> crystal surface orientation is used in the present embodiment. Accordingly, when this substrate is etched by an alkaline aqueous solution, the fine concave 106 in a shape of a quadrangular pyramid placed facedown, that is, in a so-called inverted pyramid shape as shown in FIG. 7 is formed. This is because the rate of the etching by an alkaline aqueous solution is different depending on a surface orientation. The etching rate is the highest in a <100> surface, the second highest in a <110> surface, and the lowest in a <111> surface. In the case of a semi-spherical shape like the first concave 104, while the surface orientation continuously changes depending on parts, by the etching using an alkaline aqueous solution, the etching proceeds at a rate according to the surface orientation and then stops substantially automatically when the <111> surface is exposed.

Etching proceeds slowly after the time when the <111> surface is exposed. Accordingly, when the etching time is too long, a terrace part 107 as a flat part is eliminated and thus an adhesion part between the mask film 102 and the substrate 101a is eliminated, so that the mask film 102 comes off. Meanwhile, when the etching time is too short, the flat terrace part 107 remains large, which hinders reduction in light reflectance on the surface of the substrate 101a. In the present embodiment, the width of the terrace part 107 was set to 0.5 micrometer.

When a single-crystal silicon substrate with a <100> surface orientation is used as the substrate 101a, the inverted pyramid-shaped fine concave 106 has a quadrangular pyramid shape with its bottom surface being a square. By arranging the fine openings 103 on a tetragonal lattice, the width of the terrace part 107 can be maintained constant at each part and an inverted pyramid-shaped concave-convex structure can be uniformly formed on the surface of the substrate 101a. Therefore, maximum suppression of the light reflectance on the surface of the substrate 101a and prevention of the coming off of the mask film 102 can be achieved simultaneously.

While an etching rate ratio between the <100> surface and the <111> surface is increased by adding IPA to an etching solution in the present embodiment, as long as the surface of the substrate 101a exposed under the fine opening 103 of the mask film 102 (the surface 105 of a first concave) can be anisotropically etched, other additives can be added or no additive can be used. This does not cause any problem for realizing the present invention. While an aqueous solution of sodium hydroxide is used as the etching solution in the present embodiment, other alkaline solutions such as an aqueous solution of potassium hydroxide can be used.

Figure 8:
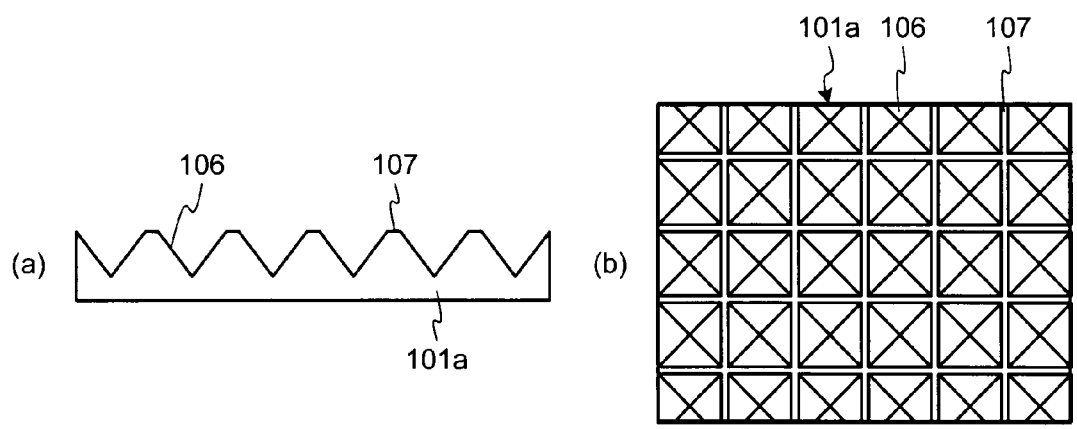
FIG. 8 is an explanatory diagram of a step of the method for roughening a substrate surface according to the first embodiment of the present invention.

At Step 6, the mask film 102 is removed by wet etching as a fourth etching step. An etching solution prepared by diluting 50% hydrofluoric acid with pure water so as to be 20% by volume was used for removing the mask film 102 in the present embodiment. The temperature of chemical is a room temperature and the processing time is 6 minutes. By removing the mask film 102 in such a manner, a structure such that the inverted pyramid-shaped fine concave 106 was uniformly laid on the surface of the substrate 101a as shown in FIG. 8 was obtained. The etching solution can be appropriately changed depending on conditions such as a material for the mask film 102 used.

By the steps explained above, the substrate 101 having the fine concave-convex structure (the texture structure) such that the inverted pyramid-shaped fine concave 106 is substantially uniformly formed on the substrate surface as shown in FIG. 1 can be obtained.

Figure 9:
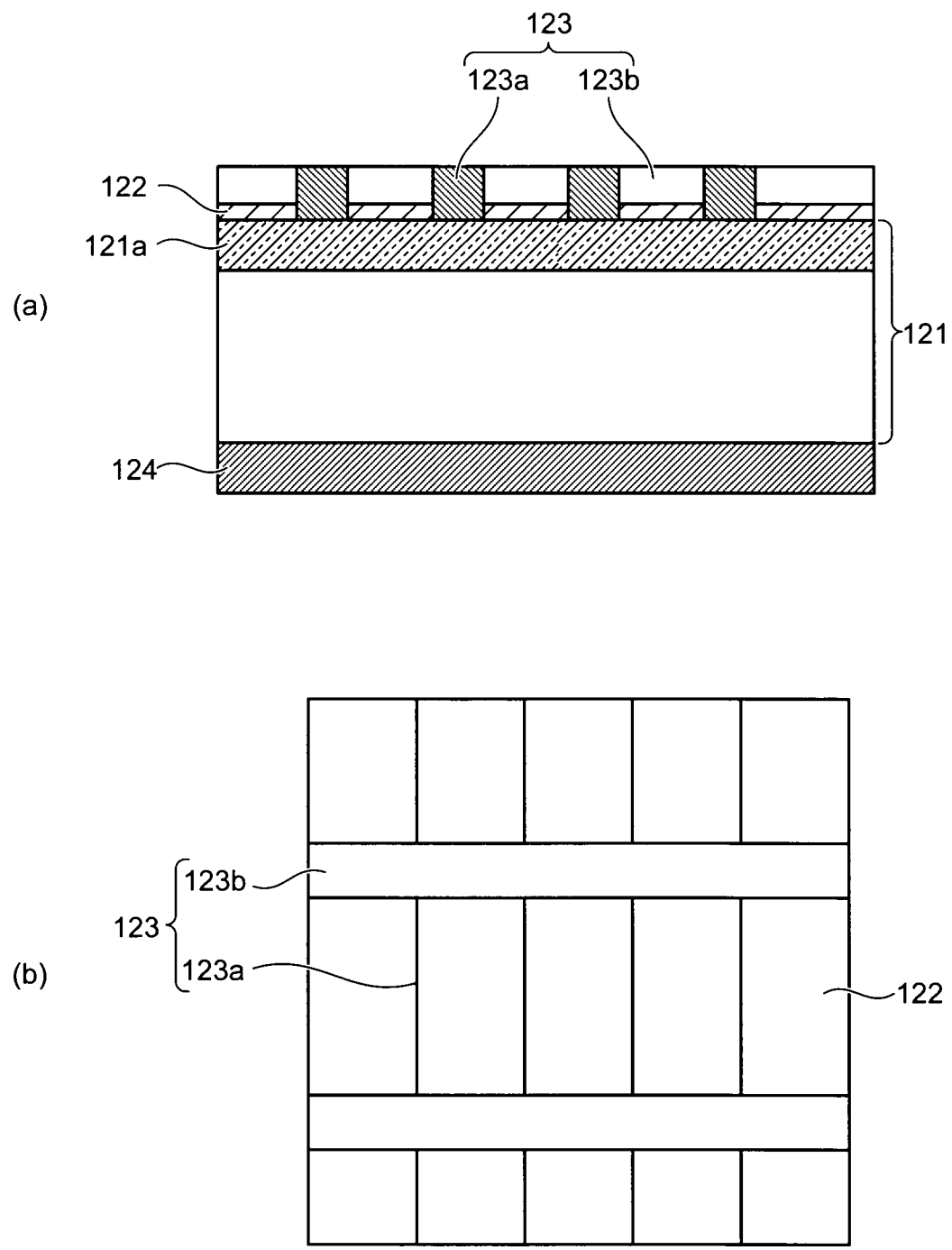
FIG. 9 depicts a photovoltaic device according to the first embodiment of the present invention produced by using a substrate.

FIG. 9 depicts a photovoltaic device produced by using the substrate 101 explained above. FIG. 9(a) is a cross-sectional view and FIG. 9(b) is a top view. The photovoltaic device shown in FIG. 9 includes a first-conductive-type semiconductor substrate 121 having an N layer 121a as an impurity diffusion layer such that a second-conductive-type impurity is diffused in a substrate surface layer, a reflection preventing film 122 formed on a light-receiving surface-side surface (a surface) of the semiconductor substrate 121, a light-receiving surface-side electrode 123 formed on the light-receiving surface-side surface (the surface) of the semiconductor substrate 121, and a back electrode 124 formed on a surface of the semiconductor substrate 121 opposite to the light receiving surface (a back surface).

As the light-receiving surface-side electrode 123, a grid electrode 123a and a bus electrode 123b of the photovoltaic device are provided. FIG. 9(a) is a cross-sectional view in a cross-section vertical to a longitudinal direction of the grid electrode 123a. A 156 mm☐ photovoltaic device is constituted by using the substrate 101 that the inverted pyramid-shaped fine concave-convex structure is formed on the substrate surface by the method for roughening a substrate surface explained above for the semiconductor substrate 121.

Steps for manufacturing the photovoltaic device shown in FIG. 9 using the substrate 101 explained above are explained next. Because the following steps are the same as general manufacturing steps of a photovoltaic device using a silicon substrate, these steps are not shown in the drawings.

The substrate 101 subjected to the Step 6 is charged in a thermal oxidation furnace and heated under an oxyphosphorus chloride ($POCl_3$) vapor to form phosphorus glass on the surface of the substrate 101, so that phosphorus is diffused in the substrate 101 and the second-conductive-type N layer 121a is thus formed on the surface layer of the substrate 101. A diffusion temperature is, for example, 840° C. Therefore, the semiconductor substrate 121 having the N layer 121a on the substrate surface layer can be obtained. Because a p-type silicon substrate is used in the present embodiment, phosphorus of a different conductive type is diffused to form a pn junction. When an n-type silicon substrate is used, a p-type impurity can be diffused.

Next, the phosphorus glass layer of the substrate 121 is removed in a hydrofluoric acid solution, and an SiN film is then formed on the N layer 121a as the reflection preventing film 122 by plasma CVD. The thickness and the refractive index of the reflection preventing film 122 are set to values suppressing light reflection in a maximized manner. Two or more films having different refractive indexes can be stacked. The reflection preventing film 122 can be formed by different film forming methods such as sputtering.

A paste in which silver is mixed is then printed on the light receiving surface of the substrate 121 in a comb shape by screen printing. A paste in which aluminum is mixed is printed on the entire back surface of the substrate 121 by screen printing. A calcining treatment is then performed on the resultant substrate, so that the light-receiving surface-side electrode 123 and the back electrode 124 are formed. The calcining is performed in an atmosphere at 760° C., for example. In this way, the photovoltaic device shown in FIG. 9 is produced.

The result of performance evaluation of the photovoltaic device produced by performing the above steps is explained below. In the production of the photovoltaic device, at the time when the surface of the substrate 101 was roughened, light reflection characteristics of the substrate 101 were evaluated by a spectrophotometer. The reflectance at a wavelength of 900 nanometers is shown in Table 1.

TABLE 1

|  | Substrate of first embodiment | Comparative example |
|---|---|---|
| Reflectance at wavelength of 900 nanometers | 12% | 21% |

A substrate was produced by etching a single-crystal silicon substrate with an alkaline aqueous solution as a comparative example. Light reflection characteristics of the substrate of the comparative example were evaluated by a spectrophotometer. The reflectance at a wavelength of 900 nanometers is shown in Table 1.

As can be understood from Table 1, the reflectance of the substrate of the comparative example at a wavelength of 900 nanometers is 21%. Meanwhile, the reflectance of the substrate 101 having the inverted pyramid-shaped texture structure by performing roughening by the method for roughening a substrate surface according to the first embodiment can be suppressed to 12%. As a result, it was found that the substrate 101 roughened by the method for roughening a substrate surface according to the first embodiment exhibits an excellent reflectance-suppressing effect.

The produced photovoltaic device was actually operated and power generation characteristics were measured and evaluated. As the result of measurement and evaluation, an open circuit voltage Voc (Vm), a short-circuit current density Jsc ($mA/cm^2$), a fill factor FF and a photoelectric conversion efficiency η (%) are shown in Table 2.

TABLE 2

|  | Photovoltaic device of first embodiment | Comparative example |
|---|---|---|
| Open circuit voltage Voc (mV) | 634.6 | 635.3 |
| Short-circuit current density Jsc ($mA/cm^2$) | 35.9 | 34.5 |
| Fill factor FF | 0.7794 | 0.7811 |
| Photoelectric conversion efficiency η (%) | 17.8 | 17.1 |

As a comparative example, a 156 mm□ photovoltaic device was produced by using the substrate of the comparative example explained above. The photovoltaic device of the comparative example was actually operated and power generation characteristics were measured and evaluated. As the result of measurement and evaluation, an open circuit voltage Voc (Vm), a short-circuit current density Jsc ($mA/cm^2$), a fill factor FF, and the photoelectric conversion efficiency η (%) are also shown in Table 2.

As can be understood from Table 2, when comparing to the photovoltaic device of the comparative example, the short-circuit current density is significantly increased and the photoelectric conversion efficiency is improved in the photovoltaic device according to the first embodiment. By constituting a photovoltaic device using the substrate 101 roughened by the method for roughening a substrate surface according to the first embodiment, it was found that suppression of a surface reflection loss of the substrate 101 worked well and thus the short-circuit current density was significantly increased to contribute to an improvement in the photoelectric conversion efficiency.

As explained above, according to the method for roughening a substrate surface of the first embodiment, the fine opening 103 is uniformly formed in the mask film 102 formed on the surface of the substrate 101a by the laser processing and the surface of the substrate 101a in an underneath area of the fine opening 103 is etched. Therefore, the texture structure having the inverted pyramid-shaped concave 106 can be uniformly and densely formed on the entire surface of the substrate 101a.

Isotropic etching by an acid solution is performed as the first etching step to form the first concave 104 under the mask film 102 as an undercut. Therefore, the processing time of the laser processing on the mask film 102 can be reduced. As the second etching step, the oxide film 104a formed on the surface of the first concave 104 is removed by an aqueous solution of hydrofluoric acid to expose the surface 105 of a first concave. Therefore, the instability of forming concaves and convexes can be eliminated and a state that etching of the first concave 104 by an alkaline solution easily proceeds can be created. As the third etching step, anisotropic etching is performed on the surface 105 of a first concave by an alkaline solution. Therefore, the inverted pyramid-shaped concave 106 can be uniformly formed in the underneath area of the fine opening 103.

Therefore, according to the method for roughening a substrate surface of the first embodiment, fine roughening can be easily and uniformly performed on the surface of the substrate 101a without requiring any expensive devices and redundant manufacturing steps as those in lithography. Roughening of a substrate that exhibits an excellent reflection-suppressing effect can be performed and the light-reflection suppressing effect can be maximized over the entire surface of the substrate 101a.

Furthermore, according to the method for manufacturing a photovoltaic device of the first embodiment, a photovoltaic device is produced by using the substrate 101 having its surface roughened by the method for roughening a substrate surface of the first embodiment explained above. Therefore, a photovoltaic device that a surface light-reflection loss on a light-incident-side substrate surface is significantly reduced, the photoelectric conversion efficiency is improved, and an excellent photoelectric conversion efficiency is provided can be produced. Accordingly, at the time of producing a photovoltaic device with a photoelectric conversion efficiency equal to a conventional one, the area of a substrate can be reduced, raw materials for the substrate can be also reduced, and a compact, light-weight, and volume-reduced photovoltaic device can be achieved.

Second Embodiment

In a case of forming electrodes by screen printing, when unevenness of a surface of a base is large, printability is degraded. Particularly, because a concave-convex structure (a texture structure) for light confinement exists on a light-receiving-surface-side surface of a solar battery substrate, a printed film is interrupted or a part of the printed film having a significantly reduced thickness is generated. While a thin grid electrode is usually formed as a light-receiving surface-side electrode for reducing a shadow loss, the concave-convex structure of the substrate causes disconnection in this case.

Figure 10:
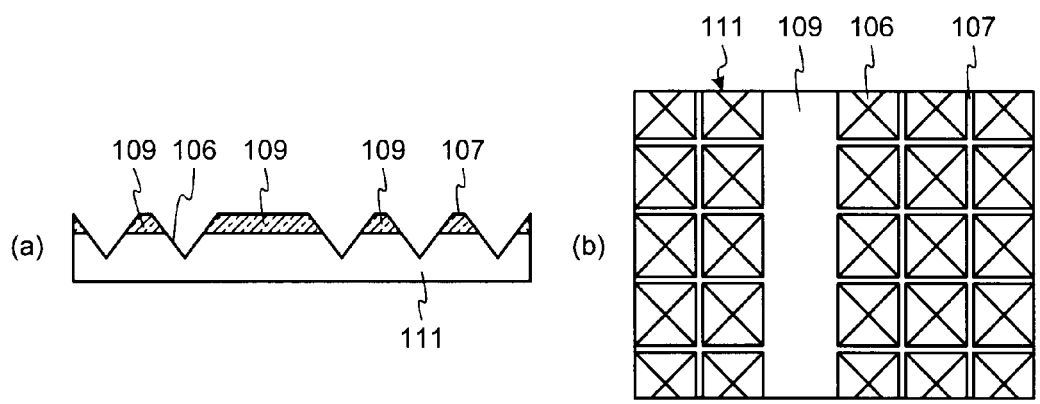
FIG. 10 depicts a p-type single-crystal silicon substrate having its surface roughened by a method for roughening a substrate surface according to a second embodiment of the present invention.

A second embodiment explains a method for roughening a substrate surface and a method for manufacturing a photovoltaic device that can solve the above problems. FIG. 10 depicts a first-conductive-type substrate for a solar battery as a photovoltaic device, that is, a p-type single-crystal silicon substrate 111 (hereinafter, "substrate 111") having its surface roughened by the method for roughening a substrate surface according to the present embodiment. FIG. 10(a) is a cross-sectional view and FIG. 10(b) is a top view. In the cross-sectional view, its top is shown as a light-receiving-surface side. The top view is viewed from the light-receiving-surface side. This substrate 111 has a texture structure such that the inverted pyramid-shaped fine concave 106 with an average pitch between holes of about 10 micrometers is substantially uniformly formed on a light-receiving-surface-side substrate surface. An n+ layer 109 is formed on the terrace part 107.

The method for roughening a substrate surface for forming the substrate 111 and steps for manufacturing a photovoltaic device according to the second embodiment are explained next. FIGS. 11 to 20 are explanatory diagrams of the method for roughening a substrate surface and manufacturing steps of a photovoltaic device according to the second embodiment. In FIGS. 11 to 20, the drawings to which (a) is attached are cross-sectional views and correspond to FIG. 10(a), and the drawings to which (b) is attached are top views and correspond to FIG. 10(b). Basic configurations of the photovoltaic device according to the present embodiment are identical to those of the photovoltaic device according to the first embodiment shown in FIG. 9, and thus explanations thereof will be omitted.

Figure 11:
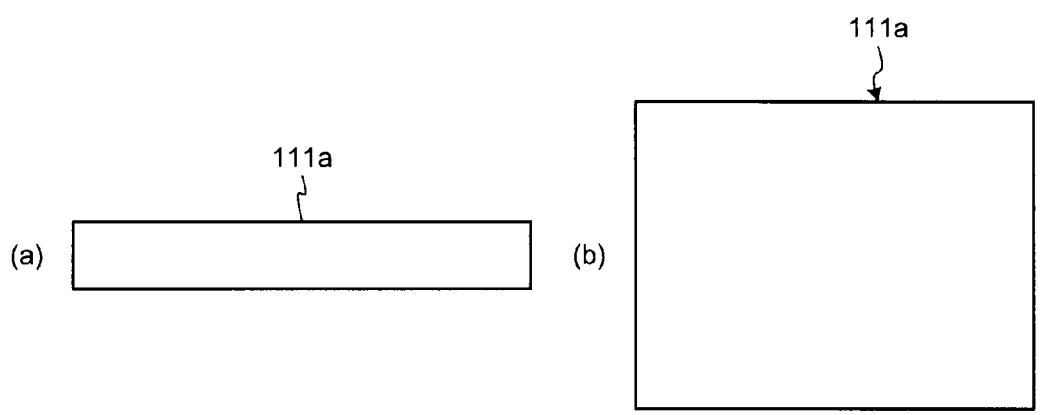
FIG. 11 is an explanatory diagram of a step of the method for roughening a substrate surface according to the second embodiment of the present invention.

At Step 11, a p-type single-crystal silicon substrate 111a (hereinafter, "substrate 111a") shown in FIG. 11 is prepared first and the n+ layer 109 is then formed on a surface and a back surface of the substrate 111a by a first diffusion process. The substrate 111a is obtained by, like the substrate 101a, slicing a silicon ingot produced by casting or pulling using a multi-wire saw, then washing the resultant silicon using an organic solvent, and removing damaged layers using an acid solution or an alkaline solution. A 156×156-mm square p-type single-crystal silicon substrate having a thickness of 180 micrometers is used in the present embodiment. The size of the substrate 111a is not limited to this size and can be appropriately changed. To remove damaged layers, the substrate 101a was immersed in, for example, a 10% by-weight aqueous solution of sodium hydroxide heated to 80° C., for about 2 minutes for an immersion process. Conditions for removing damaged layers are not limited to these conditions. As long as damaged layers can be removed, conditions other than the above ones can be used.

Figure 12:
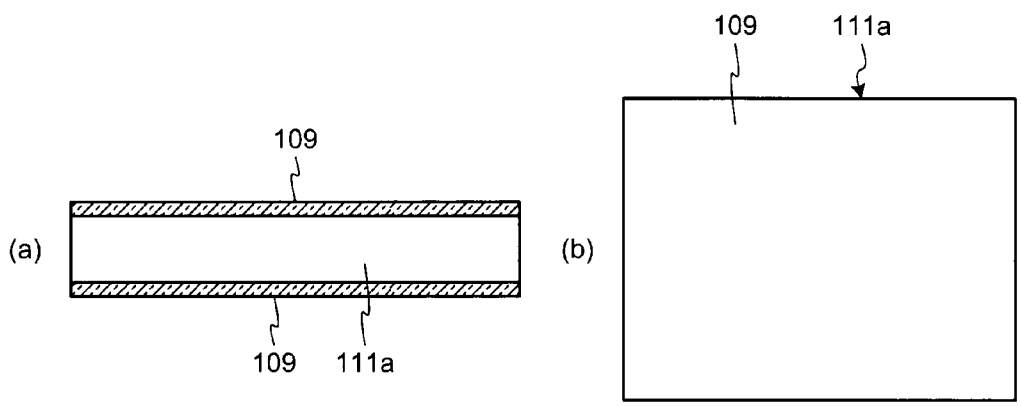
FIG. 12 is an explanatory diagram of a step of the method for roughening a substrate surface according to the second embodiment of the present invention.

In the first diffusion process, the substrate 111a is charged in a thermal oxidation furnace and heated under an oxyphosphorus chloride ($POCl_3$) vapor to form phosphorus glass on the surface of the substrate 111a, so that phosphorus is diffused in the substrate 111a and the n+ layer 109 as a first impurity-diffusion layer having a first density that is relatively high phosphorus density is thus formed on the surface layer of the substrate 101. The significance of setting a phosphorus density to be high is described later. Because a p-type silicon substrate is used in the present embodiment, phosphorus of a different conductive type is diffused to form a pn junction. When an n-type silicon substrate is used, a p-type impurity can be diffused. The phosphorus glass layer is then removed in an aqueous solution of hydrofluoric acid, so that the n+ layer 109 is exposed on the surface of the substrate 111a as shown in FIG. 12.

Figure 13:
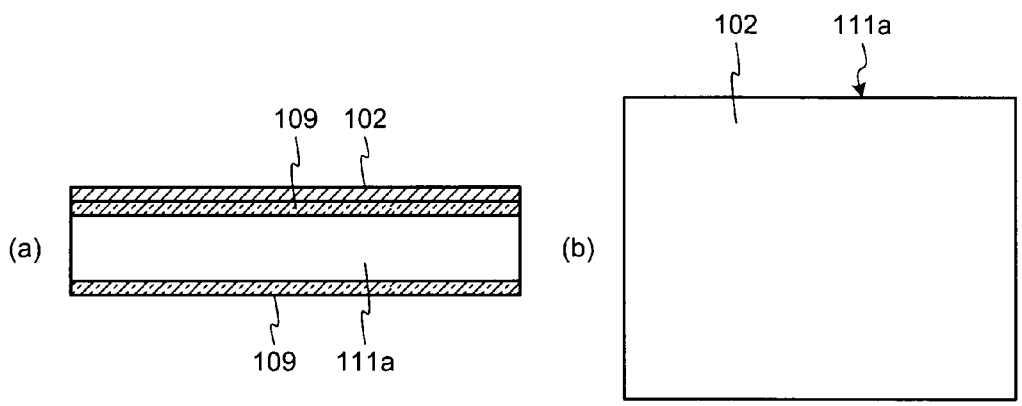
FIG. 13 is an explanatory diagram of a step of the method for roughening a substrate surface according to the second embodiment of the present invention.

At the subsequent Step 12, the mask film 102 having etching resistance to etching (described later) is formed as a protection film on one-surface-side surface of the substrate 111a, that is, on the surface of the n+ layer 109 as shown in FIG. 13.

Figure 14:
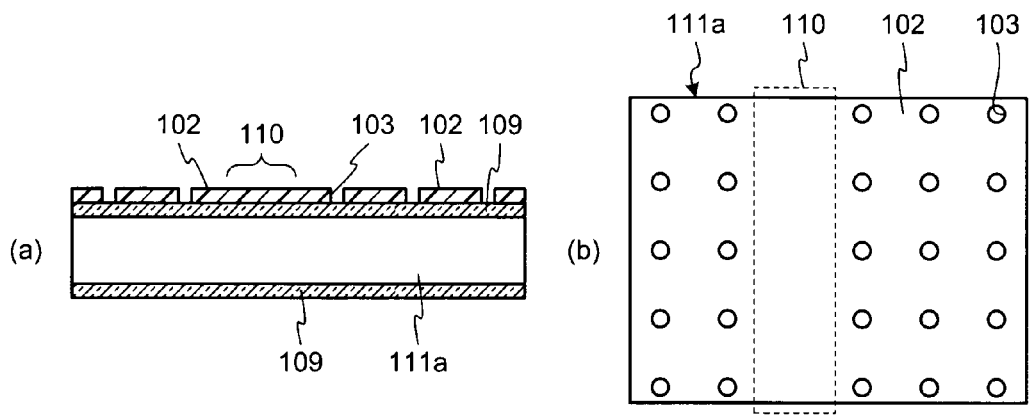
FIG. 14 is an explanatory diagram of a step of the method for roughening a substrate surface according to the second embodiment of the present invention.

At the subsequent Step 13, fine hole processing is performed on the mask film 102 as at Step 2 of the first embodiment, as shown in FIG. 14. That is, a plurality of the fine openings 103 are formed in the mask film 102 by a laser processing treatment. The Step 13 is characterized such that the fine opening 103 is not formed in a forming area 110 of a light-receiving surface-side electrode. A 355-nm laser, which was a third harmonic wave of Nd-YAG laser, was used as a laser. As shown in FIG. 14, fine holes having a diameter of diameter 2 micrometers were processed on lattice points of a tetragonal lattice that a distance between points was 10 micrometers.

Figure 15:
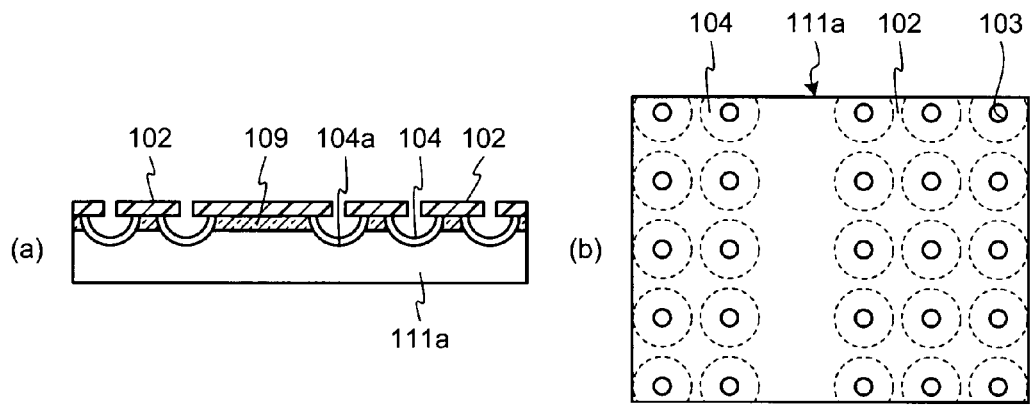
FIG. 15 is an explanatory diagram of a step of the method for roughening a substrate surface according to the second embodiment of the present invention.

At the subsequent Step 14, isotropic etching is performed as a first etching step like Step 3 of the first embodiment. That is, the substrate 111a is immersed in an acid solution and etched by using the mask film 102 as an etching mask. The surface of the substrate 111a exposed at the bottom of the fine opening 103 of the mask film 102 is thus isotropically etched, so that the first concave 104 is formed as shown in FIG. 15. At this time, the oxide film 104a is formed on the surface of the first concave 104. At this Step 14, it is characterized such that the first concave 104 is not formed in the forming area 110 of a light-receiving surface-side electrode. At Step 14, the n+ layer 109 formed on the back surface of the substrate 111a is also removed.

An aqueous solution of hydrofluoric acid and nitric acid prepared by mixing 50% hydrofluoric acid with 69% nitric acid at a volume ratio of 1:7 was used as an acid solution in an etching solution in the present embodiment. The temperature of chemical is 10° C. When silicon is etched by this etching solution, the etching does not depend on a crystal surface orientation but proceeds substantially isotropically, so that a substantially semi-spherical first concave 104 is formed as shown in FIG. 15. This etching characteristic is important for forming an undercut under the mask film 102. This etching characteristic is also important for enabling reduction in an opening area of the mask film 102 by the laser processing, that is, reduction in the laser processing time. The first etching step ended when the diameter of the first concave 104 was 8 micrometers in the present embodiment.

Figure 16:
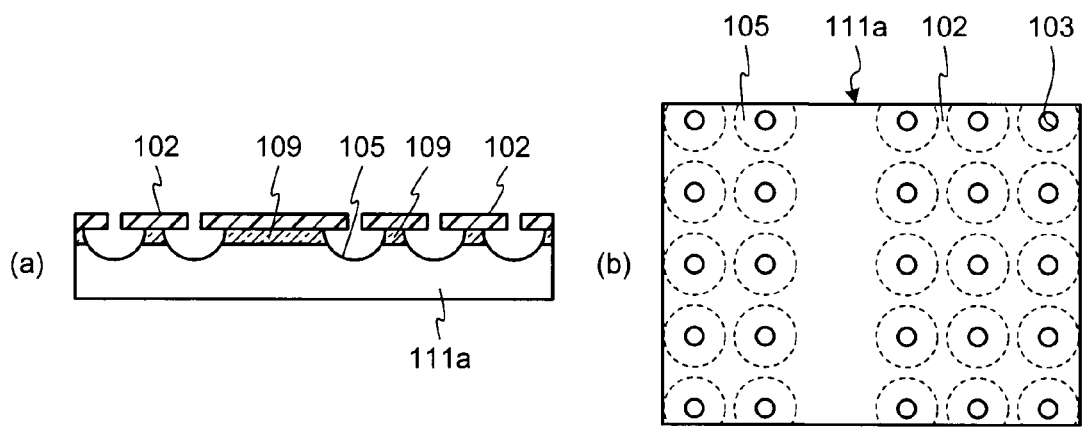
FIG. 16 is an explanatory diagram of a step of the method for roughening a substrate surface according to the second embodiment of the present invention.

At the subsequent Step 15, oxide-film removal etching is performed as a second etching step like Step 4 of the first embodiment. That is, the substrate 111a subjected to the first etching step is immersed in an aqueous solution of hydrofluoric acid and etched by using the mask film 102 as an etching mask so as to remove the oxide film 104a, so that the surface 105 of a first concave is exposed as shown in FIG. 16. In the present embodiment, an aqueous solution of hydrofluoric acid prepared by diluting 50% hydrofluoric acid with water so as to be 20% by volume was used as an etching solution. The temperature of chemical is a room temperature and a processing time is 30 seconds.

Figure 17:
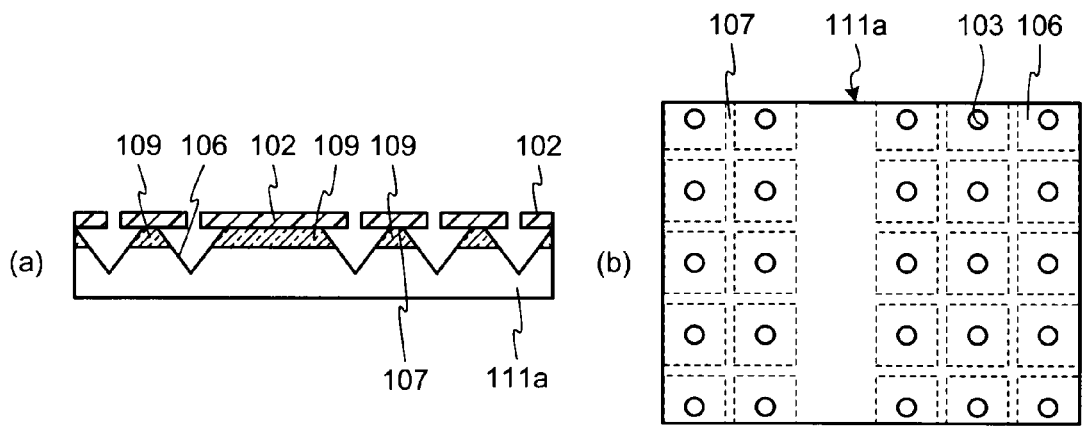
FIG. 17 is an explanatory diagram of a step of the method for roughening a substrate surface according to the second embodiment of the present invention.

At the subsequent Step 16, anisotropic etching is performed as a third etching step. That is, the substrate 111a subjected to the second etching step is immersed in an alkaline solution and etched by using the mask film 102 as an etching mask, so that the surface of the substrate 111a exposed under the fine opening 103 of the mask film 102 (a the surface 105 of a first concave) is anisotropically etched. Consequently, the second concave (the inverted pyramid-shaped fine concave) 106 is formed as shown in FIG. 17. At this Step 16, the second concave (the inverted pyramid-shaped fine concave) 106 is not formed in the forming area 110 of a light-receiving surface-side electrode. The n+ layer 109 is formed on the terrace part 107 and the forming area 110 of a light-receiving surface-side electrode.

An alkaline aqueous solution prepared by adding 1% by weight of IPA (isopropyl alcohol) to a 10% by-weight aqueous solution of sodium hydroxide was used in the present embodiment. In the present embodiment, the width of the terrace part 107 was set to 0.5 micrometer.

Figure 18:
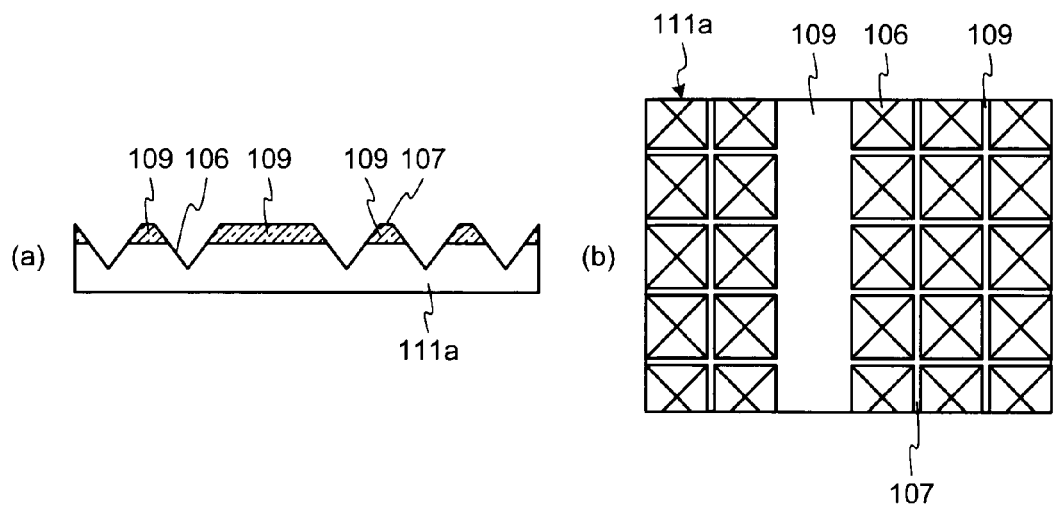
FIG. 18 is an explanatory diagram of a step of the method for roughening a substrate surface according to the second embodiment of the present invention.

At the subsequent Step 17, the mask film 102 is removed by wet etching as a fourth etching step. In the present embodiment, an etching solution prepared by diluting 50% hydrofluoric acid with pure water so as to be 20% by volume was used for removing the mask film 102. The temperature of chemical is a room temperature and the processing time is 6 minutes. By removing the mask film 102 in such a manner, as shown in FIG. 18, a structure such that the inverted pyramid-shaped fine concave 106 was uniformly laid on the surface of the substrate 111a was obtained.

Figure 19:
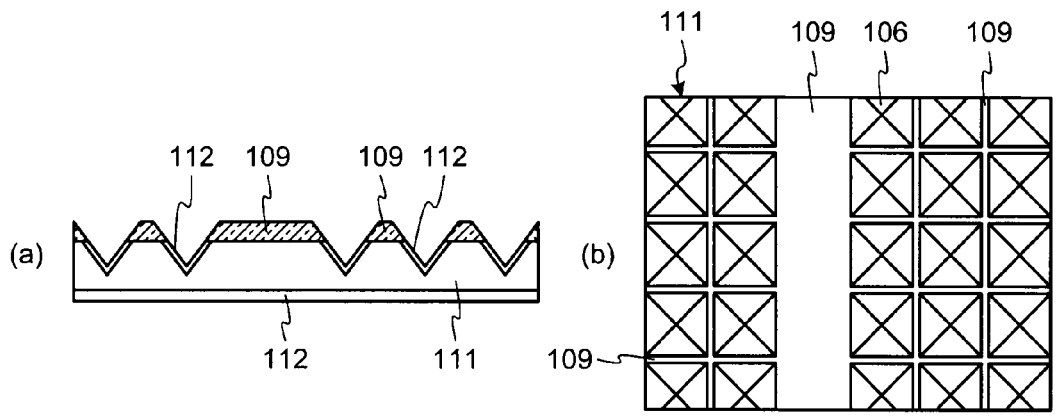
FIG. 19 is an explanatory diagram of a manufacturing step of a photovoltaic device according to the second embodiment of the present invention.
Figure 20:
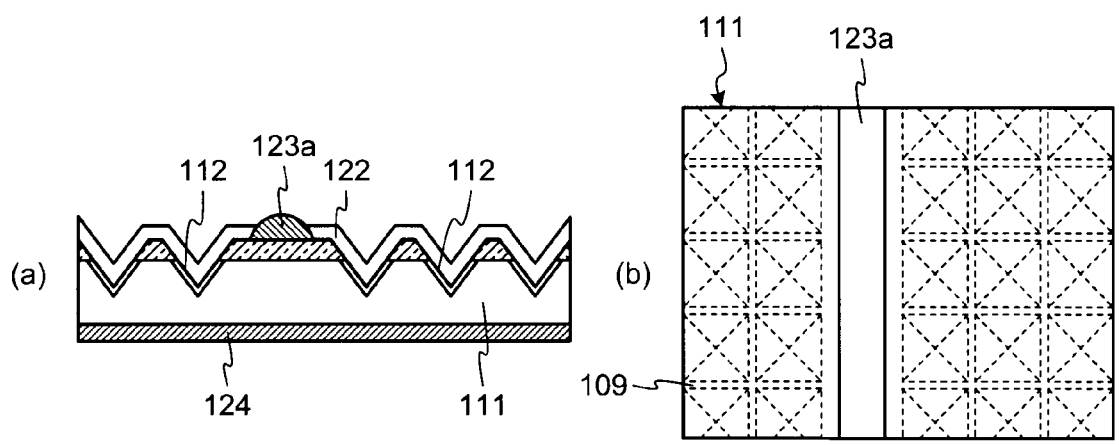
FIG. 20 is an explanatory diagram of a manufacturing step of the photovoltaic device according to the second embodiment of the present invention.

At the subsequent Step 18, phosphorus is diffused on the surface of the substrate 111a by a second diffusion process at a second density, which is lower than the first density, as the phosphorus diffusion density of the n+ layer 109, so that a shallow n+ layer 112 as a second impurity-diffusion layer whose phosphorus diffusion density is lower than that of the n+ layer 109 is formed. In the second diffusion process, the substrate 111a is charged in a thermal oxidation furnace and heated under an oxyphosphorus chloride ($POCl_3$) vapor to form phosphorus glass on the surface of the substrate 111a, so that phosphorus is diffused in the substrate 111a and thus the shallow n+ layer 112 is formed on the surface of the second concave (the inverted pyramid-shaped fine concave) 106 and the back surface of the substrate 111a. While a shallow n+ layer is also formed on the terrace part 107, the n+ layer 109 has been already formed on the terrace part 107 by the first diffusion process. Accordingly, the phosphorus density varies little in the second diffusion process. The phosphorus glass layer is then removed in an aqueous solution of hydrofluoric acid, so that the shallow n+ layer 112 and the n+ layer 109 formed in the first diffusion process are exposed as shown in FIG. 19.

By the steps explained above, as shown in FIG. 10, the substrate 111 that has the fine concave-convex structure (the texture structure) in which the inverted pyramid-shaped fine concave 106 is substantially uniformly formed on the substrate surface and that the second concave (the inverted pyramid-shaped fine concave) 106 is not formed in the forming area 110 of a light-receiving surface-side electrode can be obtained.

An SiN film is then formed as the reflection preventing film 122 on the shallow n+ layer 112 and the n+ layer 109 by plasma CVD. The thickness and the refractive index of the reflection preventing film are set to values that suppress light reflection in a maximized manner. Two or more films having different refractive indexes can be stacked. In addition, the reflection preventing film 122 can be formed by different film forming methods such as sputtering.

A paste in which silver is mixed is printed on the light receiving surface of the substrate 111 in a comb shape by screen printing. A paste in which aluminum is mixed is printed on the entire back surface of the substrate 111 by screen printing. At this time, the texture structure is not formed in the forming area of a light-receiving surface electrode and the base is the n+ layer 109. A calcining treatment is then performed on the resultant substrate, so that the light-receiving surface-side electrode 123 and the back electrode 124 are formed. The calcining is performed in an atmosphere at 760° C., for example. The shallow n+ layer 112 formed on the back surface of the substrate 111 can be ignored by printing and calcining the paste in which aluminum is mixed. In this way, the photovoltaic device shown in FIG. 9 is produced.

The result of performance evaluation of the photovoltaic device produced by performing the above steps is explained. The produced photovoltaic device was actually operated to measure and evaluate power generation characteristics. As the result of measurement and evaluation, an open circuit voltage Voc (Vm), a short-circuit current density Jsc (mA/$cm^2$), a fill factor FF, and a photoelectric conversion efficiency η (%) are shown in Table 3.

TABLE 3

|  | Photovoltaic device of second embodiment | Comparative example |
|---|---|---|
| Open circuit voltage Voc (mV) | 634.8 | 635.3 |
| Short-circuit current density Jsc (mA/$cm^2$) | 37.0 | 34.5 |
| Fill factor FF | 0.7832 | 0.7811 |
| Photoelectric conversion efficiency η (%) | 18.4 | 17.1 |

As a comparative example for comparing power generation characteristics with those of the photovoltaic device of the present embodiment, the photovoltaic device of the comparative example produced in the first embodiment was used. The power generation characteristics of the comparative example are also shown in Table 3.

As can be understood from Table 3, when comparing to the photovoltaic device of the comparative example, the short-circuit current density is significantly increased and the photoelectric conversion efficiency is improved in the photovoltaic device according to the second embodiment. By constituting a photovoltaic device using the substrate 101 roughened by the method for roughening a substrate surface according to the second embodiment, it was found that suppression of the surface reflection loss of the substrate 101 worked well and thus the short-circuit current density was significantly increased to contribute to an improvement in the photoelectric conversion efficiency.

Because the texture structure is not formed in the forming area of the light-receiving surface-side electrode 123 in the photovoltaic device according to the present embodiment, excellent electrode formability is provided and the dependency of an electrode cross-section area on the place where an electrode cross-section is formed is reduced. Accordingly, conductor resistance is not partially increased in the light-receiving surface-side electrode 123 and thus an excellent fill factor can be maintained. This can be also confirmed from the result of Table 3.

Further, the short-circuit current density is improved as compared to that of the photovoltaic device according to the first embodiment. This is because the shallow n+ layer 112 is formed on the surface of the second concave (the inverted pyramid-shaped fine concave) 106 by the second diffusion process at Step 18. While a pn junction is required to obtain a photovoltaic power, when the impurity density (the phosphorus density) of an n+ layer is too high, recombination of minority carriers is accelerated, so that a loss is generated. By providing the n+ layer so as to have a density of minimum shallow diffusion, the short-circuit current density can be improved as in the present embodiment.

On the other hand, when all n+ layers are formed as shallow n+ layers, there is another problem. That is, when diffusion of an n+ layer is shallow in the part where the light-receiving surface-side electrode 123 is formed, contact resistance is increased and the fill factor is deteriorated. However, because the n+ layer 109 is formed on the forming area 110 of a light-receiving surface-side electrode in the photovoltaic device according to the present embodiment, this is a factor of improving the fill factor.

As explained above, according to the method for roughening a substrate surface of the second embodiment, the fine opening 103 is uniformly formed in the mask film 102 formed on the surface of the substrate 111a by the laser processing and the surface of the substrate 111a in an underneath area of the fine opening 103 is etched. Therefore, the texture structure having the inverted pyramid-shaped fine concave 106 can be uniformly and densely formed on the entire surface of the substrate 111a.

Because isotropic etching by an acid solution is performed as the first etching step to form the first concave 104 under the mask film 102 as an undercut, the processing time of the laser processing on the mask film 102 can be reduced. As the second etching step, the oxide film 104a formed on the surface of the first concave 104 is removed by an aqueous solution of hydrofluoric acid to expose the surface 105 of a first concave. Therefore, the instability of forming convexes and convexes can be eliminated and a state that etching of the first concave 104 by an alkaline solution easily proceeds can be created. As the third etching step, anisotropic etching is performed on the surface 105 of a first concave by an alkaline solution. The inverted pyramid-shaped fine concave 106 can be thus uniformly formed in the underneath area of the fine opening 103.

Because the texture structure is not formed in the forming area of the light-receiving surface-side electrode 123 in the method for manufacturing a photovoltaic device according to the second embodiment, uniformity of the cross-section area of the light-receiving surface-side electrode 123 is improved, the conductor resistance is reduced, and an excellent fill factor can be obtained. Because the shallow n+ layer 112 is formed on the surface of the second concave (the inverted pyramid-shaped fine concave) 106, carrier recombination loss can be reduced and the short-circuit current density can be improved. Because the n+ layer 109 is formed on the forming area of the light-receiving surface-side electrode 123, contact resistance to a light-receiving surface-side electrode can be reduced and an excellent fill factor can be obtained.

Therefore, according to the method for roughening a substrate surface of the second embodiment, without requiring any expensive devices and redundant manufacturing steps as those in lithography, fine roughening can be easily and uniformly performed on the surface of the substrate 111a. Roughening of a substrate that exhibits an excellent reflection-suppressing effect can be performed and the light-reflection suppressing effect can be maximized over the entire surface of the substrate 111a.

INDUSTRIAL APPLICABILITY

As described above, the method for roughening a substrate surface and the method for manufacturing a photovoltaic device according to the present invention are useful for uniformly forming an inverted pyramid-shaped concave-convex structure over a wide area of a substrate by processing in a short time.

| Reference Signs List | |
|---|---|
| 101 | p-TYPE SINGLE-CRYSTAL SILICON SUBSTRATE HAVING ITS SURFACE ROUGHENED |
| 101a | p-TYPE SINGLE-CRYSTAL SILICON SUBSTRATE |
| 102 | MASK FILM |
| 103 | FINE OPENING |
| 104 | FIRST CONCAVE |
| 104a | OXIDE FILM |
| 105 | SURFACE OF FIRST CONCAVE |
| 106 | SECOND CONCAVE (INVERTED PYRAMID-SHAPED FINE CONCAVE) |
| 107 | TERRACE PART |
| 109 | n+ LAYER |
| 110 | FORMING AREA OF LIGHT-RECEIVING SURFACE-SIDE ELECTRODE |
| 111 | p-TYPE SINGLE-CRYSTAL SILICON SUBSTRATE HAVING ITS SURFACE ROUGHENED |
| 111a | p-TYPE SINGLE-CRYSTAL SILICON SUBSTRATE |
| 112 | SHALLOW n+ LAYER |
| 121 | SEMICONDUCTOR SUBSTRATE |
| 121a | N LAYER |
| 122 | REFLECTION PREVENTING FILM |
| 123 | LIGHT-RECEIVING SURFACE-SIDE ELECTRODE |
| 123a | GRID ELECTRODE |

-continued

| Reference Signs List | |
|---|---|
| 123b | BUS ELECTRODE |
| 124 | BACK ELECTRODE |

The invention claimed is:

1. A method for roughening a substrate surface comprising:
a first step of forming a protection film on a surface of a semiconductor substrate;
a second step of forming an opening in the protection film;
a third step of isotropically etching a surface of the semiconductor substrate on which the protection film is formed by using the protection film in which the opening is formed as a mask so as to form an etched first concave under the opening and its vicinity area;
a fourth step of etching a surface of the semiconductor substrate on which the protection film is formed by using the protection film in which the opening is formed as a mask so as to remove an oxide film formed on the etched surface of the first concave formed under the opening and its vicinity area;
a fifth step of anisotropically etching a surface of the semiconductor substrate on which the protection film is formed by using the protection film in which the opening is formed as a mask so as to form a second concave under the opening and its vicinity area; and
a sixth step of removing the protection film.

2. The method for roughening a substrate surface according to claim 1, wherein
the semiconductor substrate is made of crystal silicon,
the second step is a step of performing laser processing to form an opening in the protection film,
isotropic etching at the third step is an etching using an acid solution,
an etching process at the fourth step is an etching using an aqueous solution of hydrofluoric acid, and
anisotropic etching at the fifth step is an etching using an alkaline solution.

3. The method for roughening substrate a surface according to claim 2, wherein the semiconductor substrate is made of single crystal silicon whose crystal surface orientation is <100>.

4. The method for roughening a substrate surface according to claim 2, wherein fine holes are arranged on lattice points of a tetragonal lattice in the laser processing process.

5. A method for manufacturing a photovoltaic device comprising:
a roughening step of roughening one surface side of the semiconductor substrate of a first conductive type by the method for roughening a substrate surface according to claim 1;
an impurity-diffusion-layer forming step of diffusing a second conductive-type impurity element on one surface side of the semiconductor substrate to form an impurity diffusion layer; and
electrodes forming step of forming electrodes on areas where electrodes are formed on one surface side of the semiconductor substrate and on the other surface side of the semiconductor substrate.

6. The method for manufacturing a photovoltaic device according to claim 5, further comprising a first impurity-diffusion-layer forming step of, prior to the roughening step, diffusing the second conductive-type impurity element at a first density on one surface side of the semiconductor substrate to form a first impurity diffusion layer, wherein
at the first step, the protection film is formed on the first impurity diffusion layer,
at the second step, an opening that reaches the first impurity diffusion layer is formed in the protection film,
at the third step, the first impurity diffusion layer and the semiconductor substrate are etched to form the first concave under the opening and its vicinity area, and
the impurity-diffusion-layer forming step is a second impurity-diffusion-layer forming step of diffusing the second conductive-type impurity element at a second density, which is lower than the first density, on a surface of the second concave to form a second impurity diffusion layer.

7. The method for manufacturing a photovoltaic device according to claim 5, wherein at the second step, the opening is not formed in an area where an electrode is formed on one surface side of the semiconductor substrate.

8. The method for roughening a substrate surface according to claim 1, wherein the oxide film is formed on the etched surface of the first concave as a result of the third step, without exposure to air.

\* \* \* \* \*